United States Patent [19]

Lin

[11] Patent Number: 5,668,348

[45] Date of Patent: Sep. 16, 1997

[54] CPU DISSIPATOR MOUNTING APPARATUS

[76] Inventor: Chun-Sheng Lin, No. 31, Sec. 1, Min Yi Road, Wu Ku Hsiang, Taipei Hsien, Taiwan

[21] Appl. No.: 537,364

[22] Filed: Oct. 2, 1995

[51] Int. Cl.[6] .................................................. H05K 7/20
[52] U.S. Cl. .......................... 174/16.3; 24/458; 248/510; 257/727; 361/704; 361/722; 411/352
[58] Field of Search ............................ 24/295, 457, 458, 24/473, 482, 625; 411/352, 516–518, 522–524, 530; 165/80.3, 185; 257/703, 707, 718, 719, 727; 174/16, 3; 267/150, 160; 248/316.7, 505, 510, 911, 912; 439/485, 487; 361/702–704, 710, 722, 717–719

[56] References Cited

U.S. PATENT DOCUMENTS 3,602,284  8/1971  Smith ................................ 151/69
5,323,845  6/1994  Kin-Shon ........................... 165/80.3
5,371,652  12/1994 Clemens ............................ 361/704
5,396,402  3/1995  Perugini ............................ 361/704
5,448,449  9/1995  Bright ................................ 361/704
5,486,981  1/1996  Blomquist ......................... 361/704
5,541,811  7/1996  Henningssom .................... 361/704
5,542,468  8/1996  Lin ..................................... 165/80.3

*Primary Examiner*—Gerald P. Tolin
*Attorney, Agent, or Firm*—Alfred Lei

[57] ABSTRACT

The present invention is to provide a dissipator mounting apparatus having a metal plate and a metal snap ring, where the two sides of the metal plate stretch upward and form an elastic tilt angle, and on one end of the metal plate bends downward and forms an opening to be firmly received in the barb of the ZIF socket, while the other end of the metal plate forms another hole for holding the snap ring whose rods stretch horizontally inward from the gap. Thus the CPU and the dissipator board can be tightly combined together with the help of the mounting apparatus.

1 Claim, 5 Drawing Sheets

CPU DISSIPATOR MOUNTING APPARATUS

FIELD OF THE INVENTION

The present invention relates generally to a CPU heat dissipator mounting apparatus and in particular to an apparatus comprising a metal plate and a U-shaped snap ring to which the dissipator and the CPU can be easily fixed onto a ZIF socket.

BACKGROUND OF THE INVENTION

As shown in FIG. 1, it is a prior art of the CPU dissipator hook up apparatus used on the ZIF socket; from the explosion view of the hook up apparatus, we can see that the rim of the frame 1 extends inwardly to form pressing boards 11, the left and the right sides of the frame 1 extend upward to form hook-up plates 12, and the front and the rear side extend upward to form blocking boards 13. The end of the hook-up plate 12 is formed with a hook 121. When in assembly, the frame 1 must be assembled with the hook-up plate facing upward. When trying to buckle up these boards together, the frame 1 must be placed between the ZIF socket 2 and the CPU 3 and the surrounding shoulder of the CPU 3 must be placed onto the pressing board 11. After these are secured, the dissipator board 4 is put on the surface of the CPU 3 and is secured on both sides by the hook 121 of the frame 1.

Such an assembling procedure is so complicated that whoever is not familiar with it will never figure out how these boards are assembled.

SUMMARY OF THE INVENTION

Therefore, to provide an effective CPU ventilation mounting apparatus, the main objective of the present invention is to provide a dissipator mounting apparatus having a metal plate and a U-shaped snap ring. The two sides of the metal plate stretch upwardly and formed an elastic tilt angle. One side of the metal plate has an open for snapping the barb fixed on ZIF socket, while the other side of the metal plate has two holes for holding the snap ring. The open of the snap ring extend inwardly two rods for inserting into the holes of the metal plate and thus for snapping the barb on the other side of the ZIF socket. Thus, the upward elasticity of the metal plate can tightly combine a CPU dissipator with CPU and achieve the purpose of ventilation.

Another objective of this invention is to provide a non-finned area on the CPU dissipator so that the metal plate can be put across the dissipator board and be buckled up with the barb on the ZIF socket, therefore, no matter what the height of the fin may be, the present invention can be adapted to them all.

Still, another objective of the invention is to provide a metal mounting apparatus with which the effect of dissipation of heat generated by CPU will be greatly increased.

The extended objective of the present invention is that the rods of the snap ring can also extend outwardly and be inserted into the hole of the metal plate, which also can achieve the purpose of ventilation and easy assemblage.

BRIEF DESCRIPTION OF THE DRAWING

The present invention will be better understood from the following description of preferred embodiments of the present invention, with reference to the attached drawings, wherein.

DETAILED DESCRIPTION OF THE PREFERRED EMBODIMENTS

Figure 1:
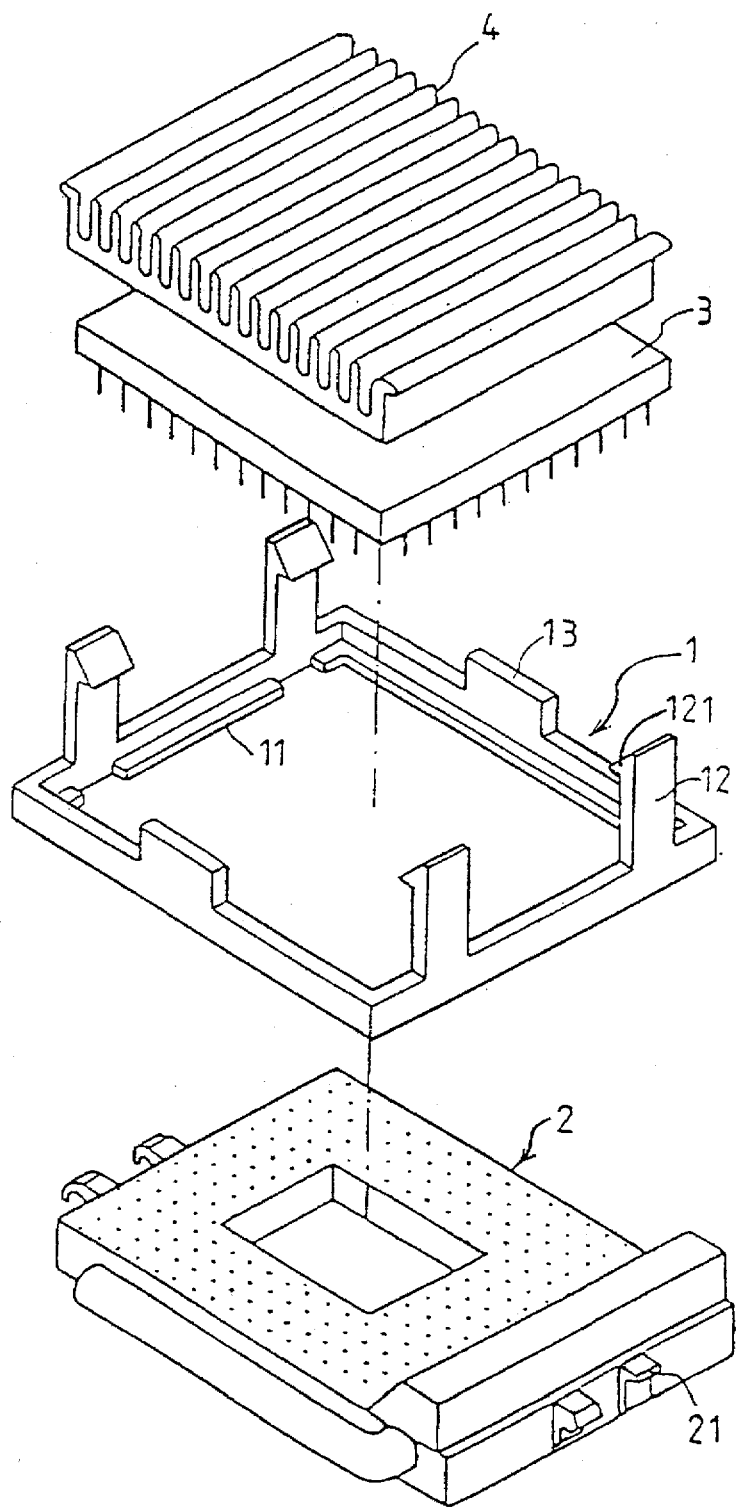
FIG. 1 is an explosion view of the prior art hook-up apparatus applied on the ZIF socket.
Figure 2:
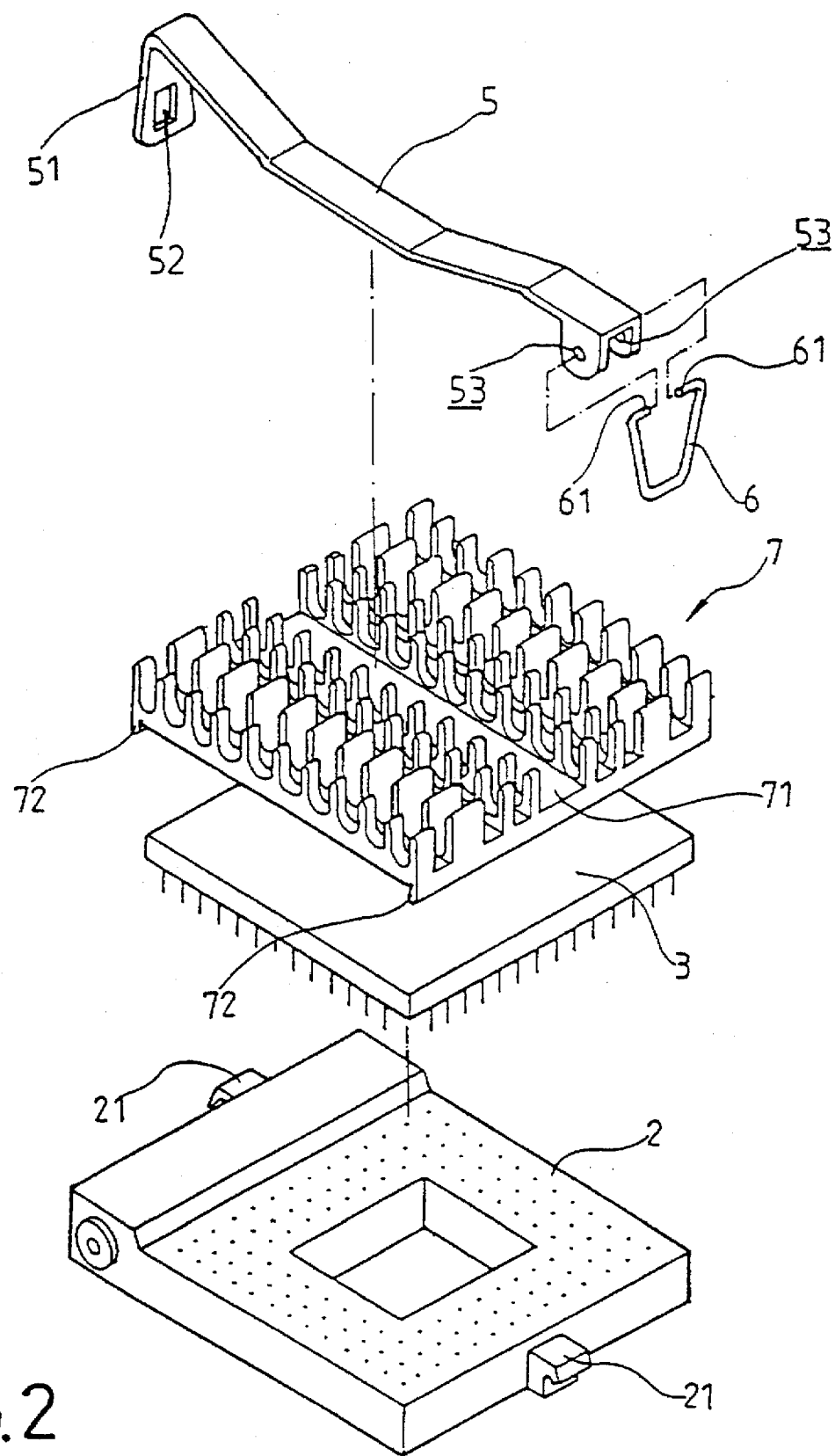
FIG. 2 is also an explosion view of the present invention showing the detail features of the mounting apparatus.

With reference to the drawings and in particular FIGS. 1–5, wherein a mounting apparatus having a metal plate and a metal snap ring constructed in accordance with the present invention, generally designated with the reference numeral 5, and 6 are shown. The two ends of the metal plate 5 extend upwardly to form an elastic tilt angle. One end 51 of the metal plate 5 is bent an angle downward from the surface of the metal plate 5. An opening 52 is formed on the end 51 for hooking up the tab 21 on the ZIF socket 2. The other end of the metal plate 5 has a hole 53 for engaging the snap ring 6.

The gap of the snap ring 6 has two inward extending rods 61 for inserting into the hole 53 of the metal plate 5, and thus to clamp the tab 21 on the other side of the ZIF socket 2. The snap ring 6 tapers downward and forms a trapezium.

A non-finned area 71 on the dissipator board 7 is formed for the metal plate 5 to cross both sides of the dissipator board 7, and to hook up with the tab 21 on the ZIF socket 2, therefore, no matter what the height the fin is, the present invention can be adapted to all sizes.

Figure 3:
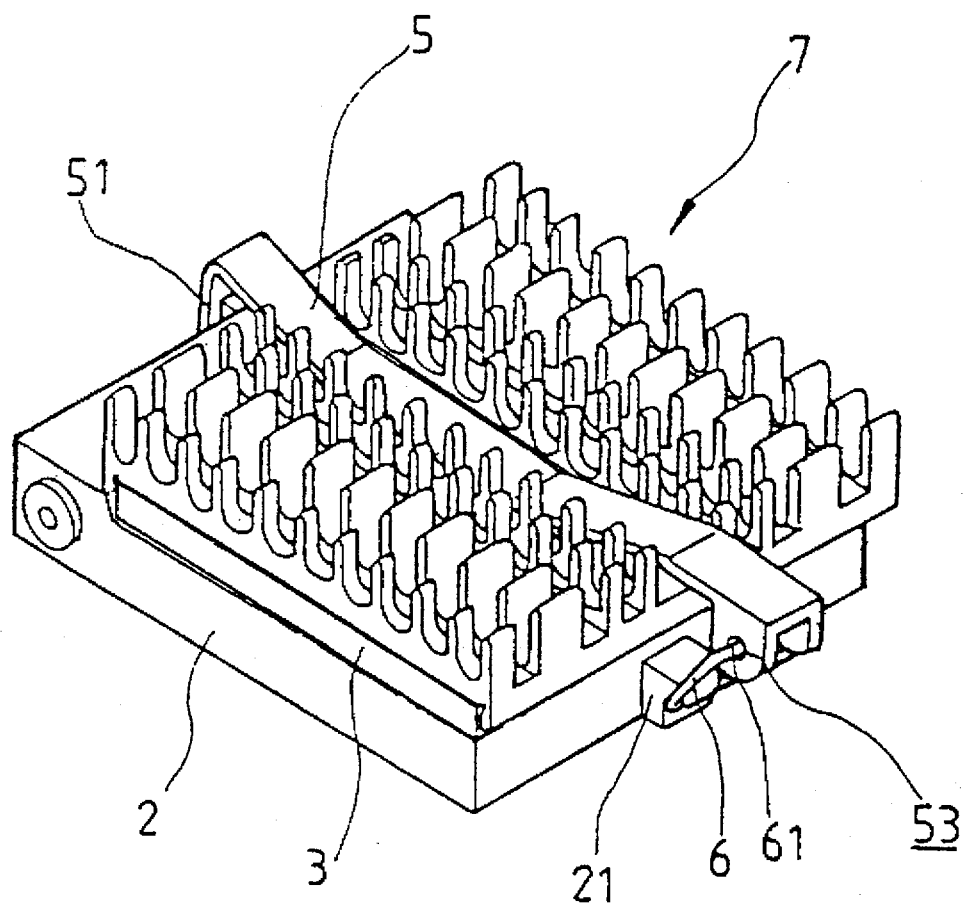
FIG. 3 is a perspective view of the present invention showing all the boards are assembled together by the mounting apparatus.
Figure 4:
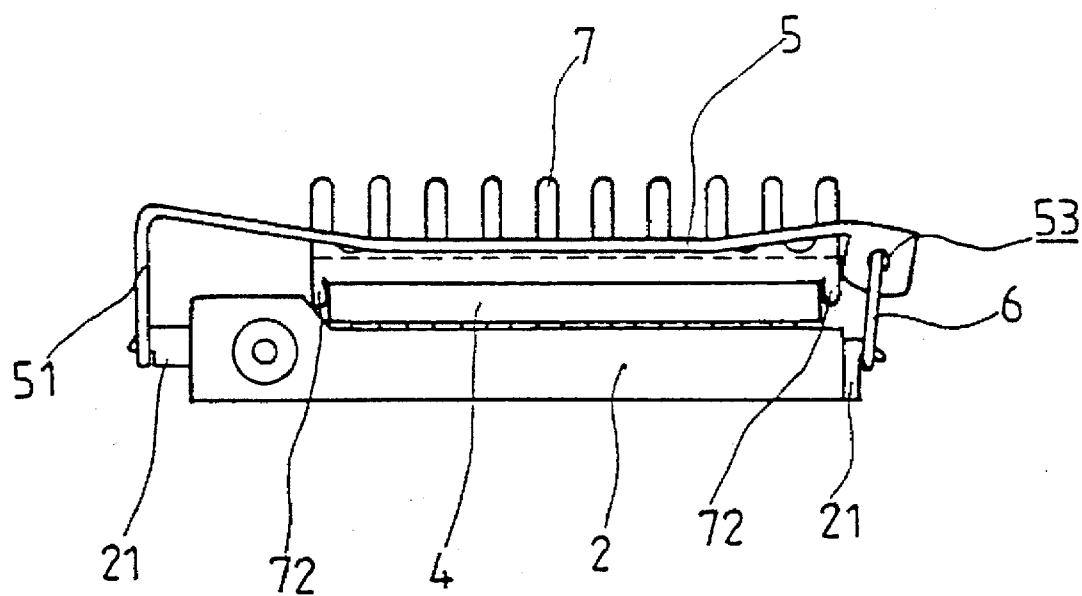
FIG. 4 is a cross-sectional view of the present invention in accordance with FIG. 2.

Referring to FIG. 3 and FIG. 4, we see that, when assembling the boards together, the CPU 3 is first inserted into the ZIF socket 2, and then the dissipator board 7 is put on the top of the CPU 3. The projection 72 on the bottom of the dissipator board 7 is so spaced as to refrain the sides of the CPU 3 from sliding. Inserting the rods 61 formed on the metal snap ring 6 into the hole 53 formed on the metal plate 5 makes the two boards a complete device. After the opening 52 on one side of the metal plate 5 is inserted into the tab 21 of the ZIF socket 2 and the metal plate 5 is lying on the non-finned area 71 of the dissipator board 7, apply pressure on the other side of the metal plate 5 with finger to make the snap ring 6 insert into the tab 21 of the ZIF socket 2. Deformation occurs on the metal plate 5, due to applying pressure on both ends of the metal plate 5, and when the pressure applied on the metal plate 5 disappears, the ends of the metal plate 5 will then spring up and restore back to the original shape and then the assemblage of CPU 3 with the dissipator board 7 is thus completed.

When disassembling, apply pressure on the side of the snap ring 6 and turn outward to make the rods 61 of the snap ring 6 separate from the bark 21 of the ZIF socket 2, and then CPU 3 will apart the dissipator board 7.

Figure 5:
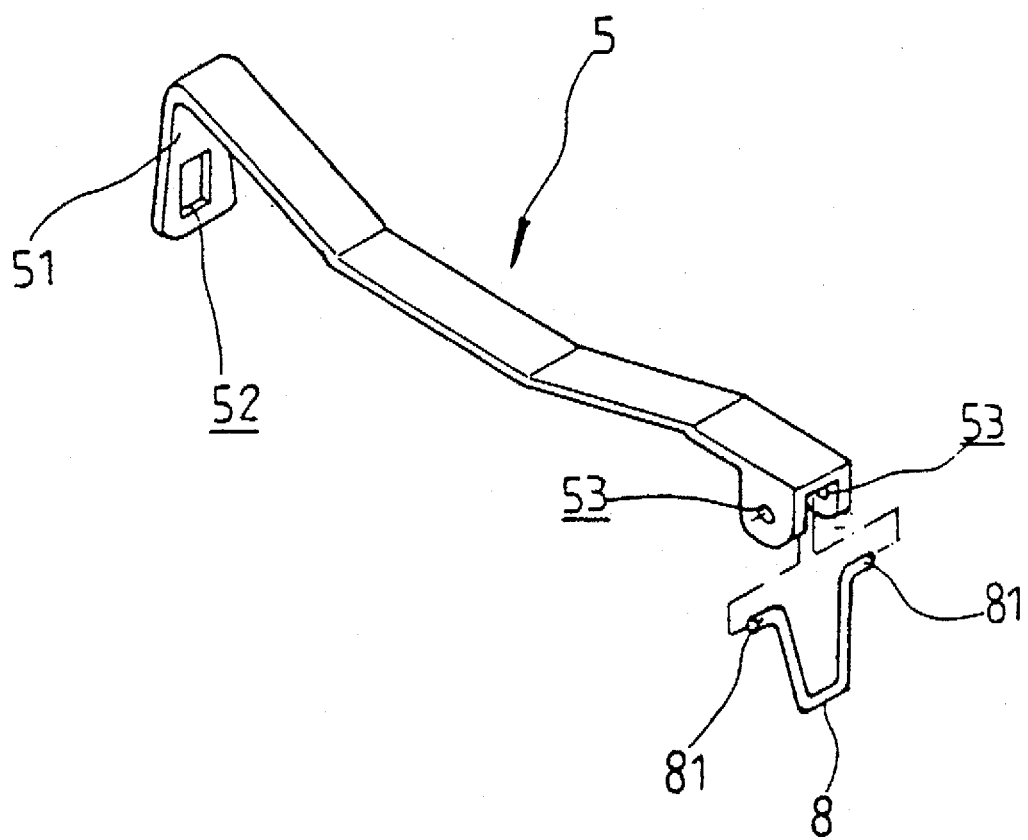
FIG. 5 is another explosion view of the present invention showing the different design of the snap ring formed on the metal plate.

Referring to FIG. 5, it is another preferential embodiment of the present invention. The snap ring 6 is transformed into another shape, whose rods 61 are now extending outward from the gap instead of inward. Therefore, the rods 61 of the snap ring 6, when tending to be held by the hole 53 of the metal plate 5, are inserted into the hole 53 of the metal plate 5 from the inner space of two holes 53.

It is apparent that although the invention has been described in connection with the embodiment as a CPU dissipator mounting apparatus, it is contemplated that those skilled in the art may make changes to the preferred embodiment without departing from the scope of the invention as defined in the appended claims and can apply the same technique to the mounting apparatus, especially the apparatus having one hole at one end and a snap ring at the other for combining CPU and the dissipator board together to serve versified functions, other uses.

What is claimed is:

1. A CPU dissipator mounting apparatus comprising:

a metal plate including two ends, the two ends including a first end and a second end, said ends stretching upward from said metal plate at an elastic tilt angle thereto, said first end including a first tilted portion and the second end including a second tilted portion, said first end including a downwardly-bent portion having a first opening, said second end including two pivot holes;

an inverted trapezoid metal snap ring having two upper ends extending horizontally and inwardly which are respectively engaged with the two pivot holes of said second end of said metal plate; and a dissipator board including a non-finned area for accepting said metal plate.

* * * * *